(12) United States Patent
Strader

(10) Patent No.: US 12,289,876 B2
(45) Date of Patent: *Apr. 29, 2025

(54) THERMALLY-CONDUCTIVE ELECTROMAGNETIC INTERFERENCE (EMI) ABSORBERS INCLUDING ALUMINUM POWDER

(71) Applicant: Laird Technologies, Inc., Chesterfield, MO (US)

(72) Inventor: Jason L. Strader, Pepper Pike, OH (US)

(73) Assignee: Laird Technologies, Inc., Chesterfield, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/399,085

(22) Filed: Dec. 28, 2023

(65) Prior Publication Data

US 2025/0024654 A1 Jan. 16, 2025

Related U.S. Application Data

(63) Continuation of application No. 17/327,435, filed on May 21, 2021, now Pat. No. 11,864,366.

(60) Provisional application No. 63/028,685, filed on May 22, 2020.

(51) Int. Cl.
*H05K 9/00* (2006.01)
*C08K 3/08* (2006.01)
*C08K 3/14* (2006.01)
*C08K 3/22* (2006.01)
(Continued)

(52) U.S. Cl.
CPC ............. *H05K 9/0083* (2013.01); *C08K 3/08* (2013.01); *C08K 3/14* (2013.01); *C08K 3/22* (2013.01); *C08L 83/06* (2013.01); *C08L 91/06* (2013.01); *C08K 2003/0812* (2013.01);
(Continued)

(58) Field of Classification Search
CPC ... C08K 2/08; C08K 2/14; C08K 2/22; C08K 2003/0812; C08K 2003/227; C08K 2201/001; C08L 83/06; C08L 91/06; C08L 2203/20; H05K 9/0083
See application file for complete search history.

(56) References Cited

U.S. PATENT DOCUMENTS

| 7,608,326 B2 | 10/2009 | Johnson |
| 10,892,204 B2 | 1/2021 | Kumura et al. |
| 11,864,366 B2 * | 1/2024 | Strader .................... C08K 3/14 |

(Continued)

FOREIGN PATENT DOCUMENTS

| KR | 100874689 B1 | 12/2008 |
| KR | 101560570 B1 | 10/2015 |

(Continued)

OTHER PUBLICATIONS

International Search Report and Written Opinion for PCT Application No. PCT/US2021/033739 that claims priority to the instant application; Sep. 15, 2021, 8 pages.

(Continued)

*Primary Examiner* — James C Goloboy
(74) *Attorney, Agent, or Firm* — Harness, Dickey & Pierce, P.L.C.; Anthony G. Fussner

(57) ABSTRACT

Disclosed are exemplary embodiments of thermally-conductive electromagnetic interference (EMI) absorbers including aluminum powder.

29 Claims, 4 Drawing Sheets

Figure 1:
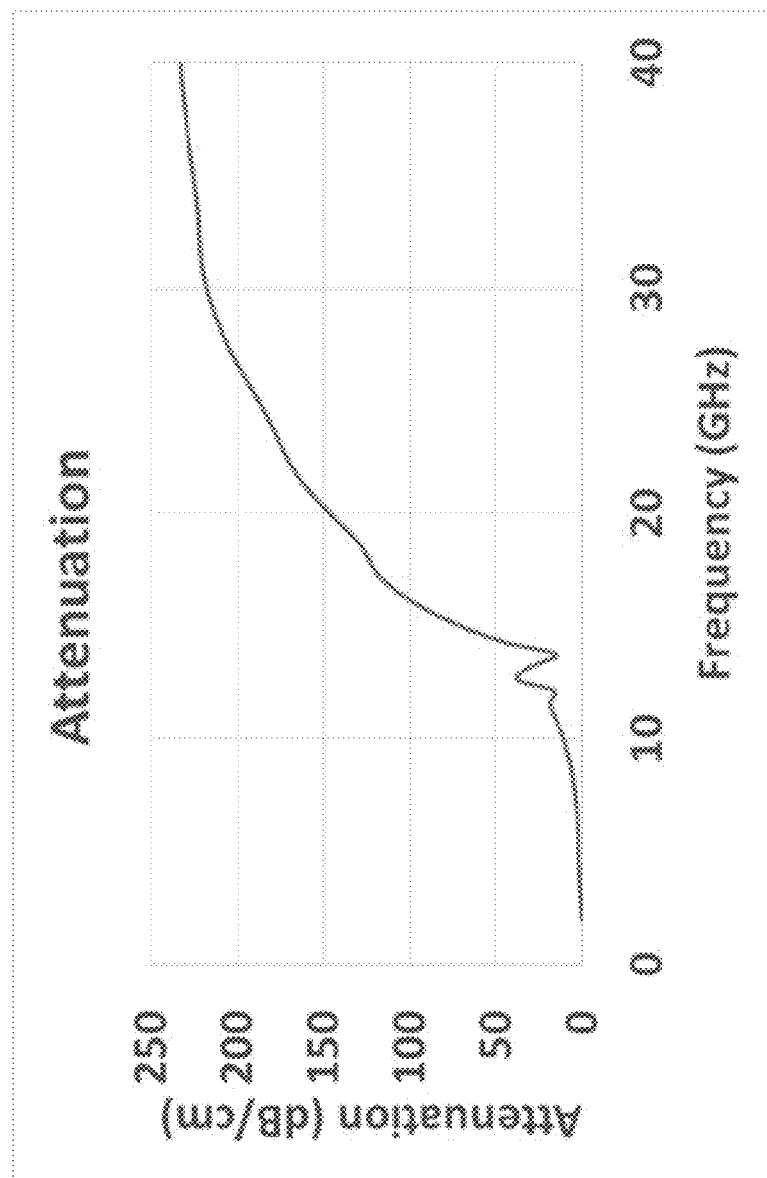

(51) Int. Cl.
   *C08L 83/06*   (2006.01)
   *C08L 91/06*   (2006.01)

(52) U.S. Cl.
   CPC ............... *C08K 2003/2227* (2013.01); *C08K 2201/001* (2013.01); *C08L 2203/20* (2013.01)

(56) References Cited

U.S. PATENT DOCUMENTS

| | | | | |
|---|---|---|---|---|
| 2008/0227310 | A1* | 9/2008 | Too | H01L 23/433 |
| | | | | 257/E23.09 |
| 2016/0160104 | A1* | 6/2016 | Bruzda | H01L 23/4275 |
| | | | | 252/74 |
| 2016/0233173 | A1* | 8/2016 | Do | C09K 5/14 |

FOREIGN PATENT DOCUMENTS

| | | |
|---|---|---|
| KR | 20190136115 A | 12/2019 |
| WO | WO-2016126449 A1 | 8/2016 |
| WO | WO-2017164406 A1 | 9/2017 |

OTHER PUBLICATIONS

Eccosorb® JCS; High Loss, Low Density, Flexible, Carbon-loaded, Silicone Rubber Sheet: www.lairdtech.com; Copyright 2015; 2 pages.

Impact of TIM Dielectric Constant on EMI Radiation; Paul Dixon, Staff Scientist, May 18, 2020; 6 pages.

Korean Office Action, and its English machine translation for KR10-2022-7043297 that claims priority to the same parent application a s the instant application; Jan. 24, 2024; 18 pages.

European Search Report for EP21809157.7 that claims priority to the instant application; dated May 14, 2024; 9 pages.

\* cited by examiner

THERMALLY-CONDUCTIVE ELECTROMAGNETIC INTERFERENCE (EMI) ABSORBERS INCLUDING ALUMINUM POWDER

CROSS-REFERENCE TO RELATED APPLICATIONS

This application is a continuation of U.S. patent application Ser. No. 17/327,435 filed May 21, 2021 (published as US2021/0368659 on Nov. 25, 2021 and issuing as U.S. Pat. No. 11,864,366 on Jan. 2, 2024), which, in turn, claims priority to and the benefit of U.S. Provisional Patent Application No. 63/028,685 filed May 22, 2020. The entire disclosures of the above applications are incorporated herein by reference.

FIELD

The present disclosure relates to thermally-conductive EMI absorbers including aluminum powder.

BACKGROUND

This section provides background information related to the present disclosure which is not necessarily prior art.

Electrical components, such as semiconductors, integrated circuit packages, transistors, etc., typically have pre-designed temperatures at which the electrical components optimally operate. Ideally, the pre-designed temperatures approximate the temperature of the surrounding air. But the operation of electrical components generates heat. If the heat is not removed, the electrical components may then operate at temperatures significantly higher than their normal or desirable operating temperature. Such excessive temperatures may adversely affect the operating characteristics of the electrical components and the operation of the associated device.

To avoid or at least reduce the adverse operating characteristics from the heat generation, the heat should be removed, for example, by conducting the heat from the operating electrical component to a heat sink. The heat sink may then be cooled by conventional convection and/or radiation techniques. During conduction, the heat may pass from the operating electrical component to the heat sink either by direct surface contact between the electrical component and heat sink and/or by contact of the electrical component and heat sink surfaces through an intermediate medium or thermal interface material (TIM). The thermal interface material may be used to fill the gap between thermal transfer surfaces, in order to increase thermal transfer efficiency as compared to having the gap filled with air, which is a relatively poor thermal conductor.

In addition, a common problem in the operation of electronic devices is the generation of electromagnetic radiation within the electronic circuitry of the equipment. Such radiation may result in electromagnetic interference (EMI) or radio frequency interference (RFI), which can interfere with the operation of other electronic devices within a certain proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source.

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

DRAWINGS

The drawings described herein are for illustrative purposes only of selected embodiments and not all possible implementations, and is not intended to limit the scope of the present disclosure.

FIG. 1 is a line graph of attenuation in decibels per centimeter (dB/cm) versus frequency in gigahertz (GHz) for a 20 mil thick sample of a thermally-conductive EMI absorber including aluminum powder and aluminum oxide in a wax base or matrix material according to an exemplary embodiment. For the testing, the thermally-conductive EMI absorber sample included about 8 weight percent of the wax base/matrix material, about 5 weight percent of the aluminum oxide, and about 87 weight percent of the aluminum powder. As shown, the sample thermally-conductive EMI absorber has an attenuation greater than 100 dB/cm for frequencies of 18 GHz and above.

Figure 2:
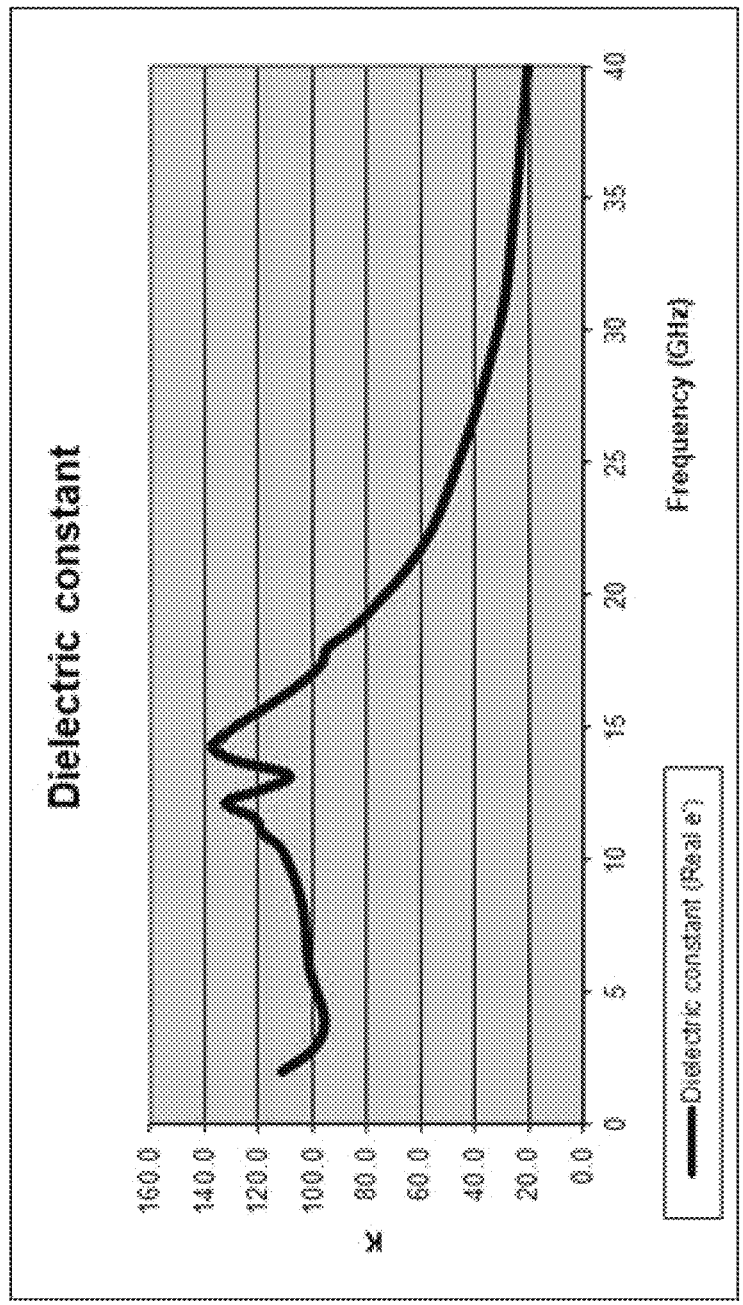

FIG. 2 is a line graph of dielectric constant (real) versus frequency in gigahertz (GHz) for a 20 mil thick sample of a thermally-conductive EMI absorber including aluminum powder and aluminum oxide in a wax base or matrix material according to an exemplary embodiment. For the testing, the thermally-conductive EMI absorber sample included about 8 weight percent of the wax base/matrix material, about 5 weight percent of the aluminum oxide, and about 87 weight percent of the aluminum powder. As shown, the thermally-conductive EMI absorber has a dielectric constant that ranged from about 100 or above for frequencies from 2 GHz to 18 GHz down to about 20 at a frequency of 40 GHz.

Figure 3:
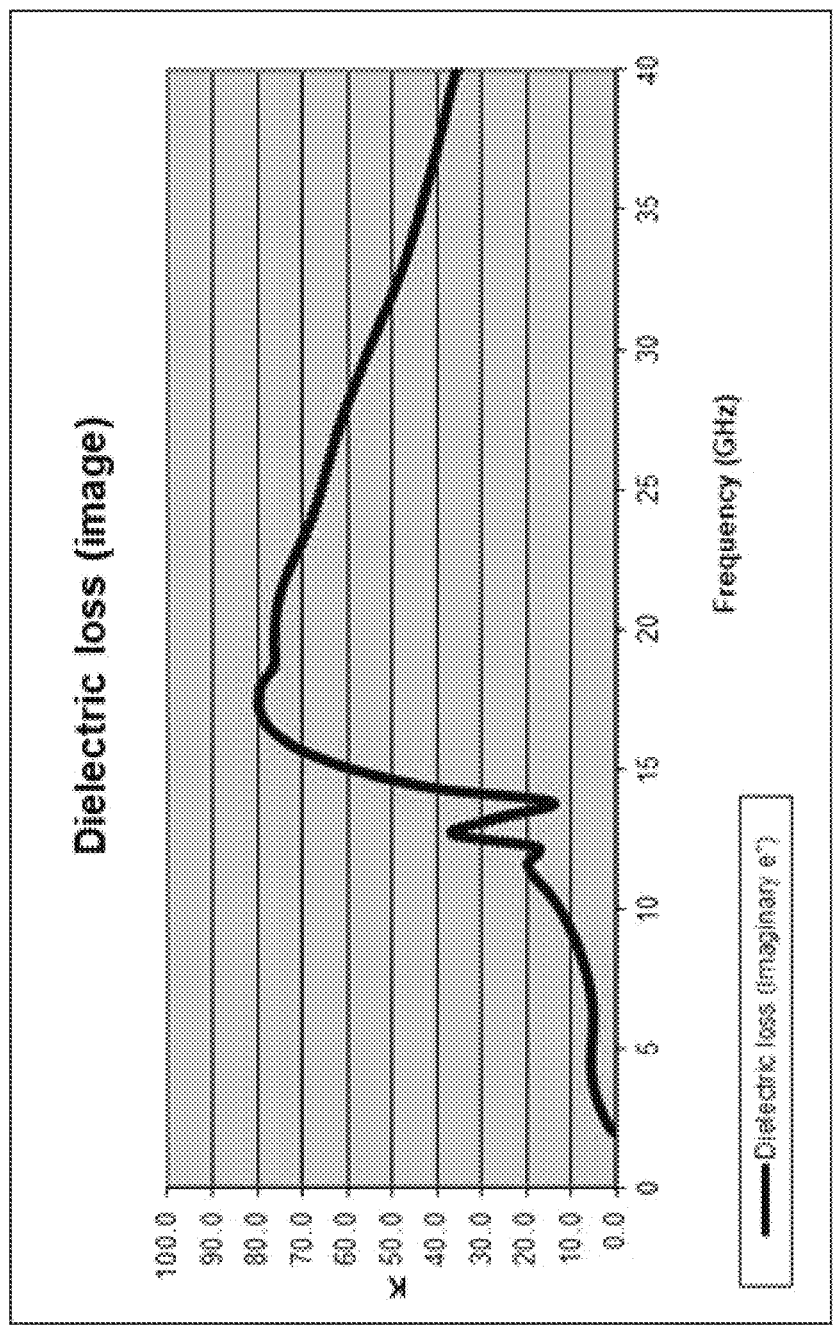

FIG. 3 is a line graph of dielectric constant (imaginary) versus frequency in gigahertz (GHz) for a 20 mil thick sample of a thermally-conductive EMI absorber including aluminum powder and aluminum oxide in a wax base or matrix material according to an exemplary embodiment. For the testing, the thermally-conductive EMI absorber sample included about 8 weight percent of the wax base/matrix material, about 5 weight percent of the aluminum oxide, and about 87 weight percent of the aluminum powder.

Figure 4:
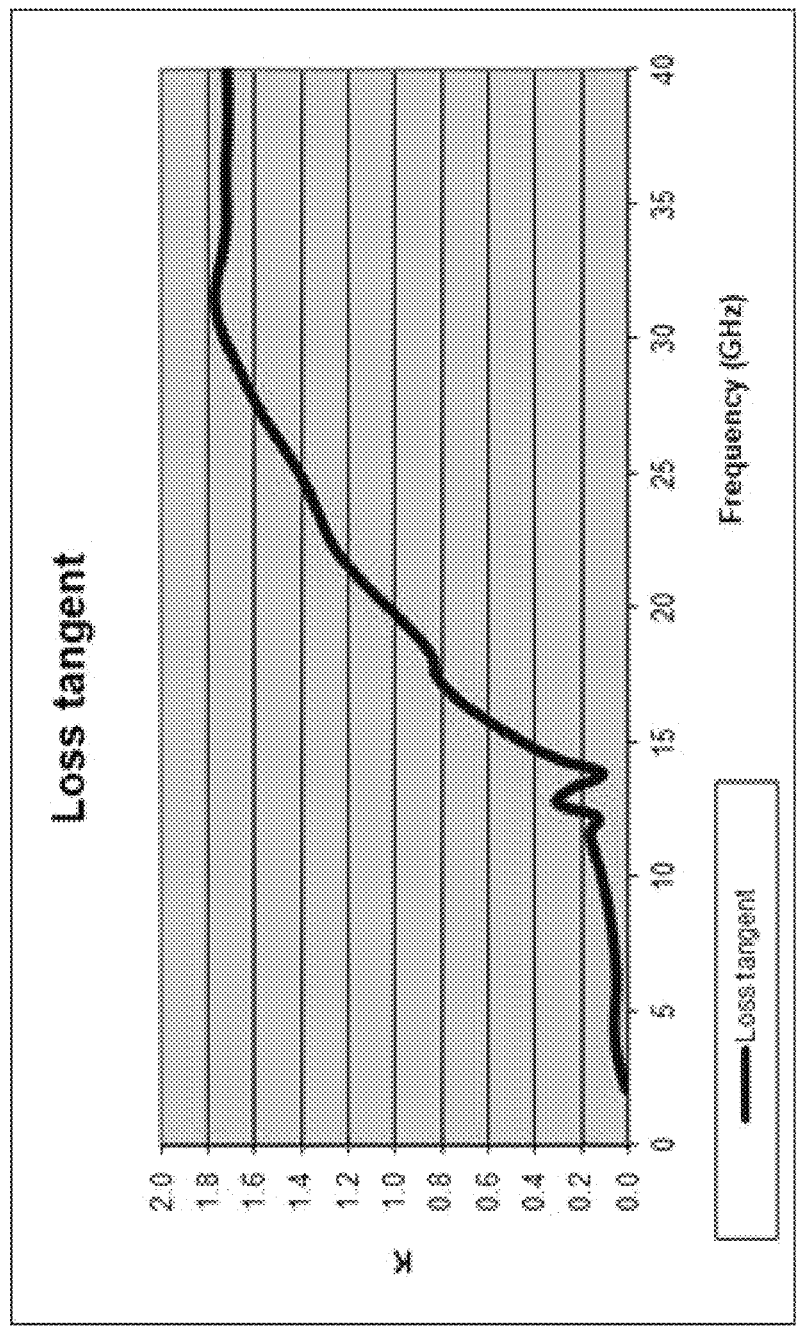

FIG. 4 is a line graph of loss tangent versus frequency in gigahertz (GHz) for a 20 mil thick sample of a thermally-conductive EMI absorber including aluminum powder and aluminum oxide in a wax base or matrix material according to an exemplary embodiment. For the testing, the thermally-conductive EMI absorber sample included about 8 weight percent of the wax base/matrix material, about 5 weight percent of the aluminum oxide, and about 87 weight percent of the aluminum powder. As shown, the thermally-conductive EMI absorber had a loss tangent of about 1 or more for frequencies of about 20 GHz and higher.

DETAILED DESCRIPTION

Example embodiments will now be described more fully with reference to the accompanying drawings.

Conventional EMI absorbers typically have a dielectric filler or magnetic filler that have been identified to be good radio wave absorbers. Commonly used magnetic fillers include carbonyl iron powder, other iron alloys, and ferrite. Less common magnetic fillers include nickel and cobalt. Commonly used dielectric fillers include carbon black and silicon carbide.

Conventional EMI absorbers may be used to absorb or attenuate radio waves. But as recognized herein, better attenuation and/or better thermal properties are needed at frequencies greater than 3 GHz than what has been provided by conventional EMI absorbers and hybrid thermally-conductive EMI absorbers. As attenuation needs increase at higher frequencies, conventional EMI absorbers materials may not have high enough attenuation.

But as recognized herein, aluminum powder may be used as an EMI absorber and/or to enhance performance (e.g., increase attenuation, etc.) of an EMI absorber. As also recognized herein, aluminum powder may be used to enhance or make a polymeric material (e.g., wax, any suitable polymeric material, etc.) suitable for use as a thermally-conductive EMI absorber. The added aluminum powder may also increase thermal conductivity of an EMI absorber, which is another added benefit, such as for integrated circuits (ICs) that require protection from EMI and/or radiate unwanted electromagnetic waves, etc.

Accordingly, disclosed herein are exemplary embodiments of thermally-conductive electromagnetic interference (EMI) absorbers including aluminum powder. Exemplary methods are disclosed for using aluminum powder as an EMI absorber and/or to enhance or make a polymeric material (e.g., wax, any suitable polymeric material, etc.) suitable for use as a thermally-conductive EMI absorber. Also disclosed are exemplary methods of increasing dielectric constant of thermally-conductive EMI absorbers by using aluminum powder. The increased dielectric constant may improve or increase the absorbing properties (e.g., increased attenuation per distance of travel at frequencies above 3 gigahertz (GHz), etc.) of the thermally-conductive EMI absorber. The aluminum powder may also provide the added benefit of increasing the thermal conductivity (e.g., about 3.0 Watts per meter per Kelvin (W/mK) or higher, etc.) of the thermally-conductive EMI absorber.

In an exemplary embodiment, a thermally-conductive EMI absorber for a thermally-conductive electromagnetic interference (EMI) absorber comprises a base or matrix material and at least one filler in the base or matrix material. The at least one filler comprises aluminum powder in a predetermined amount sufficient to increase dielectric constant of the thermally-conductive EMI absorber.

The at least one filler may further comprise silicon carbide, zinc oxide, carbonyl iron, cobalt, nickel, carbon, graphite, and/or aluminum oxide. The total filler loading in the base or matrix material depends on the matrix ranging from about 1 percent by weight to about 95 percent by weight. The base or matrix material may comprise a silicone resin, epoxy resin, or any one of many hydrocarbon resin including elastomers, thermoplastics, and thermosets. Example base or matrix materials include polymer resin, oil gel resin, silicone oil gel resin, silicone oil gel resin, a styrene and ethylene/butylene copolymers, a styrene and ethylene/propylene copolymers, a polydimethylsiloxane (PDMS); silicone polymer with platinum catalyst and cross-linker; a process oil, thermoplastic resin comprising liquid silicone, urethane, polycarbonate, polyamide, polybutylene terephthalate, polypropylene, epoxy, thermoplastic resin, thermoset non-silicone resin, etc.

The at least one filler may comprise the aluminum powder blended with any of the other fillers mentioned herein (e.g., silicon carbide, zinc oxide, carbonyl iron, cobalt, nickel, carbon, graphite, aluminum oxide), such that the total filler loading of the aluminum powder and the other fillers in the base or matrix material is at least about 1 percent by weight to about 95 percent by weight.

In an exemplary embodiment, a thermally-conductive EMI absorber includes about 7 weight percent to 9 weight percent of a wax base/matrix material (e.g., about 8 weight percent of the wax base/matrix material, etc.), about 4 weight percent to about 6 weight percent of aluminum oxide (e.g., about 5 weight percent of aluminum oxide, etc.), and about 85 weight percent to about 88 weight percent of aluminum powder (e.g., about 87 weight percent of aluminum powder, etc.). For example, the thermally-conductive EMI absorber may include about 8 weight percent of the wax base/matrix material, about 5 weight percent of the aluminum oxide, and about 87 weight percent of the aluminum powder. In addition to the wax, the wax base/matrix material may further include one or more additives, such as dispersant, process oil, block copolymer, etc.

By way of further example, the at least one filler may comprise the aluminum powder blended with silicon carbide in the base or matrix material such that a ratio of aluminum to silicon carbide in the base or matrix material is about 1.1:1 and/or such that the total filler loading of the aluminum powder and the silicon carbide in the base or matrix material is at least about 90 percent by weight.

In exemplary embodiments, the thermally-conductive EMI absorber may have a thermal conductivity of at least about 3.0 W/mK (e.g., about 3.7 W/mK or higher, 8 W/mK, etc.). The thermally-conductive EMI absorber may have a permittivity (Dk) of at least about 10 at frequencies below about 20 GHz (e.g., a permittivity (Dk) of about 50 at a frequency of about 3 GHZ and/or about 18 GHZ, etc.), a loss tangent greater than about 0.15 at frequencies above 12 GHz (e.g., a loss tangent of at least about 0.5 or 0.6 at a frequency of about 18 GHZ, etc.), a loss tangent of about 0.15 or less (e.g., about 0.04, etc.) at a frequency of about 3 GHZ, and attenuation greater than about 100 decibels per centimeter (dB/cm) (e.g., 110 dB/cm, 120 dB/cm, 140 dB/cm, etc.) at a frequency of about 18 GHz and above.

By way of example, at a frequency of about 18 GHZ, the thermally-conductive EMI absorber may have a permittivity (Dk) of about 50, a loss tangent greater than 0.5 or 0.6, an attenuation above 110 dB/m. Continuing with this example, the thermally-conductive EMI absorber may have attenuation greater than 110 dB/cm (e.g., about 140 dB/cm, etc.) at a frequency of about 60 GHz, and attenuation greater than 150 dB/cm (e.g., about 160 dB/cm, etc.) at a frequency of about 90 GHz.

The thermally-conductive EMI absorber may be a dispensable thermally-conductive EMI absorber, a pad, or a phase change thermal interface material. The thermally-conductive EMI absorber may have adhesive properties.

The thermally-conductive EMI absorber may be configured to be multifunctional having a first functionality of EMI mitigation and a second functionality of thermal management, or vice versa.

An exemplary method includes mixing at least one filler into a base or matrix material. The at least one filler comprises aluminum powder in a predetermined amount sufficient to increase attenuation such that the base or matrix material including the at least one filler is suitable for use an thermally-conductive EMI absorber.

An exemplary method of increasing dielectric constant of a thermally-conductive EMI absorber includes mixing at least one filler into a base or matrix material. The at least one filler comprises aluminum powder in a predetermined amount sufficient to increase dielectric constant of the thermally-conductive EMI absorber.

The at least one filler may further comprise silicon carbide, zinc oxide, carbonyl iron, cobalt, nickel, carbon, graphite, and/or aluminum oxide. The base or matrix material may comprise a silicone resin, epoxy resin, or any one of many hydrocarbon resin including elastomers, thermoplastics, and thermosets. The method may include mixing the at least one filler into the base or matrix material such that the total filler loading in the base or matrix material ranges from about 1 percent by weight to about 95 percent by weight (e.g., about 90 percent by weight, etc.) depending on the base or matrix material.

In an exemplary embodiment, a method may include blending aluminum powder with silicon carbide (or other fillers disclosed herein) in the base or matrix material such that the total filler loading of the aluminum powder and the silicon carbide in the base or matrix material is at least about 1 percent by weight to about 95 percent by weight (e.g., about 90 percent by weight or more, etc.).

In an exemplary embodiment, a method may include blending about 4 weight percent to about 6 weight percent of aluminum oxide (e.g., about 5 weight percent of aluminum oxide, etc.) and about 85 weight percent to about 88 weight percent of aluminum powder (e.g., about 87 weight percent of aluminum powder, etc.) in about 7 weight percent to 9 weight percent of a wax base/matrix material (e.g., about 8 weight percent of the wax base/matrix material, etc.). For example, a method may include mixing the at least one filler into the base or matrix material such that there is about 8 weight percent of the wax base/matrix material, about 5 weight percent of the aluminum oxide, and about 87 weight percent of the aluminum powder. In addition to the wax, the wax base/matrix material may further include one or more additives, such as dispersant, process oil, block copolymer, etc.

In an exemplary embodiment, a method may include blending aluminum powder with silicon carbide in a base or matrix material such that a ratio of aluminum to silicon carbide in the base or matrix material is about 1.1:1 and/or such that the total filler loading of the aluminum powder and silicon carbide in the base or matrix material is at least about 90 percent by weight.

In an exemplary embodiment, a method may include mixing the at least one filler into the base or matrix material such that the matrix including the at least one filler therein has: a thermal conductivity of at least about 3.0 W/mK (e.g., about 3.7 W/mK or higher, 8 W/mK, etc.), a permittivity (Dk) of at least about 10 at frequencies below about 20 GHz (e.g., a permittivity (Dk) of about 50 at a frequency of about 3 GHZ and/or about 18 GHz, etc.), a loss tangent greater than about 0.15 at frequencies above 12 GHz (e.g., a loss tangent of at least about 0.5 or 0.6 at a frequency of about 18 GHz, etc.), a loss tangent of about 0.15 or less (e.g., about 0.04, etc.) at a frequency of about 3 GHz, and attenuation greater than about 100 dB/cm (e.g., 110 dB/cm, 120 dB/cm, 140 dB/cm, etc.) at a frequency of about 18 GHz and above.

In an exemplary embodiment, a dispensable thermally-conductive EMI absorber comprises aluminum powder blended with silicon carbide (and/or other filler(s) disclosed herein) in a silicone resin (and/or other base or matrix material(s) disclosed herein). The aluminum powder is in an amount sufficient to increase attenuation of the dispensable thermally-conductive EMI absorber. In this exemplary embodiment, the dispensable thermally-conductive EMI absorber may have attenuation greater than about 100 dB/cm (e.g., 110 dB/cm, 120 dB/cm, 140 dB/cm, etc.) at a frequency of about 18 GHz and above. The dispensable thermally-conductive EMI absorber may have a thermal conductivity of at least about 3.0 W/mK (e.g., about 3.7 W/mK or higher, etc.). The dispensable thermally-conductive EMI absorber may have a permittivity (Dk) of at least about 10 at frequencies below about 20 GHz (e.g., a permittivity (Dk) of about 50 at a frequency of about 3 GHz and/or about 18 GHZ, etc.), a loss tangent greater than about 0.15 at frequencies above 12 GHz (e.g., a loss tangent of at least about 0.5 or 0.6 at a frequency of about 18 GHZ, etc.), and a loss tangent of about 0.15 or less (e.g., about 0.04, etc.) at a frequency of about 3 GHz.

In an exemplary embodiment, a phase change thermal interface material comprises aluminum powder blended with zinc oxide (and/or other filler(s) disclosed herein) in a silicone resin (and/or other base or matrix material(s) disclosed herein). The aluminum powder is in an amount sufficient to increase attenuation of the phase change thermal interface material. In this exemplary embodiment, the phase change thermal interface material may have attenuation greater than about 100 dB/cm (e.g., 110 dB/cm, 120 dB/cm, 140 dB/cm, etc.) at a frequency of about 18 GHz and above. The phase change thermal interface material may have a thermal conductivity of at least about 3.0 W/mK (e.g., about 3.7 W/mK or higher, etc.). The phase change thermal interface material may have a permittivity (Dk) of at least about 10 at frequencies below about 20 GHz (e.g., a permittivity (Dk) of about 50 at a frequency of about 3 GHz and/or about 18 GHZ, etc.), a loss tangent greater than about 0.15 at frequencies above 12 GHz (e.g., a loss tangent of at least about 0.5 or 0.6 at a frequency of about 18 GHZ, etc.), and a loss tangent of about 0.15 or less (e.g., about 0.04, etc.) at a frequency of about 3 GHz.

By way of example only, the phase change thermal interface material may have a permittivity (Dk) of at least about 40 at a frequency of about 3 GHz. The phase change thermal interface material may have a thermal conductivity of at least about 3 W/mK. A phase change temperature of the phase change thermal interface material may be within a range from about 40 degrees Celsius to about 70 degrees Celsius.

FIGS. 1 through 4 are respective line graphs of attenuation (dB/cm), dielectric constant (real), dielectric constant (imaginary), and loss tangent versus frequency in gigahertz (GHz) for a 20 mil thick sample of a thermally-conductive EMI absorber including aluminum powder and aluminum oxide in a wax base or matrix material according to an exemplary embodiment. For the testing, the thermally-conductive EMI absorber sample included about 8 weight percent of the wax base/matrix material, about 5 weight percent of the aluminum oxide, and about 87 weight percent of the aluminum powder. In addition to the wax, the wax base/matrix material further included dispersant, process oil, and block copolymer. The testing artifact induced glitch in the attenuation at about 14 GHz in FIG. 1 should be disregarded.

As shown by FIG. 1, the sample thermally-conductive EMI absorber has an attenuation greater than 100 dB/cm for frequencies of 18 GHz and above. The sample thermally-conductive EMI absorber also had a thermal conductivity of about 8 W/mK. In contrast, a sample that included the wax base/matrix material and the aluminum oxide but without any aluminum powder had negligible attenuation and very low thermal conductivity from about 0.25 W/mK to about 0.5 W/mK.

As shown by FIG. 2, the thermally-conductive EMI absorber has a dielectric constant that ranged from about 100 or above for frequencies from 2 GHz to 18 GHz down to about 20 at a frequency of 40 GHz. As shown by FIG. 4, the thermally-conductive EMI absorber had a loss tangent of about 1 or more for frequencies of about 20 GHz and higher.

Disclosed are exemplary embodiments of thermally-conductive electromagnetic interference (EMI) absorbers comprising a base or matrix material and at least one filler in the base or matrix material. The at least one filler comprises aluminum powder in a predetermined amount sufficient to enhance performance of the thermally-conductive electromagnetic interference (EMI) absorber.

The at least one filler further may comprise silicon carbide, zinc oxide, carbonyl iron, cobalt, nickel, carbon, graphite, and/or aluminum oxide. The base or matrix material may comprise a silicone resin and/or wax.

The total filler loading in the base or matrix material may be at least about 1 percent by weight to about 95 percent by weight including the predetermined amount of the aluminum powder sufficient to increase the thermally-conductive EMI absorber's dielectric constant and attenuation per distance of travel at frequencies above 3 gigahertz.

The thermally-conductive EMI absorber may have a thermal conductivity of at least about 3.0 Watts per meter per Kelvin. The thermally-conductive EMI absorber may have at least one or more of: a permittivity (Dk) of at least 10 at frequencies below about 20 gigahertz; a loss tangent greater than about 0.15 at frequencies above 12 gigahertz; a loss tangent of about 0.04 at a frequency of about 3 gigahertz; and attenuation above 100 decibels per centimeter at frequencies of 18 gigahertz and above.

At a frequency of about 18 gigahertz, the thermally-conductive EMI absorber may have a permittivity (Dk) of about 50, a loss tangent greater than about 0.5, and attenuation greater than about 100 decibels per centimeter.

In an exemplary embodiment, the thermally-conductive EMI absorber has: a thermal conductivity of at least about 3.0 Watts per meter per Kelvin; a permittivity (Dk) of at least 10 at frequencies below about 20 gigahertz; a loss tangent greater than about 0.15 at frequencies above 12 gigahertz; and attenuation above 100 decibels per centimeter at frequencies of 18 gigahertz and above.

In exemplary embodiments, the base or matrix material comprises a silicone resin, and the at least one filler comprises the aluminum powder blended with at least one other filler including silicon carbide in the silicone resin. The thermally-conductive EMI absorber has: a thermal conductivity of at least about 3.0 Watts per meter per Kelvin; a permittivity (Dk) of at least 10 at frequencies below about 20 gigahertz; a loss tangent greater than about 0.15 at frequencies above 12 gigahertz; and attenuation greater than 100 decibels per centimeter at frequencies of 18 gigahertz and above. In an exemplary embodiment, the thermally-conductive EMI absorber is a dispensable thermally-conductive EMI absorber, a ratio of aluminum to silicon carbide in the silicone resin is about 1.1:1, and a total filler loading of the aluminum powder and the silicon carbide in the silicone resin maybe at least about 90 percent by weight.

In exemplary embodiments, the base or matrix material comprises a silicone resin, and the at least one filler comprises the aluminum powder blended with at least one other filler including zinc oxide in the silicone resin. The thermally-conductive EMI absorber has: a thermal conductivity of at least about 3.0 Watts per meter per Kelvin; a permittivity (Dk) of at least 10 at frequencies below about 20 gigahertz; a loss tangent greater than about 0.15 at frequencies above 12 gigahertz; and attenuation greater than 100 decibels per centimeter at frequencies of 18 gigahertz and above. In an exemplary embodiment, the thermally-conductive EMI absorber is a phase change thermal interface material.

In an exemplary embodiment, the thermally-conductive EMI absorber is a phase change thermal interface material having: a thermal conductivity of at least about 3.0 Watts per meter per Kelvin; a permittivity (Dk) of at least 10 at frequencies below about 20 gigahertz; a loss tangent greater than about 0.15 at frequencies above 12 gigahertz; attenuation greater than 100 decibels per centimeter at frequencies of 18 gigahertz and above; and a phase change temperature within a range from about 40 degrees Celsius to about 70 degrees Celsius.

In an exemplary embodiment, the thermally-conductive EMI absorber is a dispensable thermally-conductive EMI absorber having: a thermal conductivity of at least about 3.0 Watts per meter per Kelvin; a permittivity (Dk) of at least 10 at frequencies below about 20 gigahertz; a loss tangent greater than about 0.15 at frequencies above 12 gigahertz; and attenuation greater than 100 decibels per centimeter at frequencies of 18 gigahertz and above.

In exemplary embodiments, the at least one filler further comprises aluminum oxide, and the base or matrix material comprises wax. The thermally-conductive EMI absorber includes about 7 weight percent to 9 weight percent of the wax base/matrix material, about 4 weight percent to about 6 weight percent of the aluminum oxide, and about 85 weight percent to about 88 weight percent of the aluminum powder. In an exemplary embodiment, the thermally-conductive EMI absorber includes about 8 weight percent of the wax base/matrix material, about 5 weight percent of the aluminum oxide, and about 87 weight percent of the aluminum powder. And the thermally-conductive EMI absorber has a thermal conductivity of at least about 8.0 Watts per meter per Kelvin, and attenuation greater than 100 dB/cm for frequencies of 18 gigahertz and above. In addition to the wax, the wax base/matrix material may further include one or more additives, such as dispersant, process oil, block copolymer, etc.

In exemplary embodiments, the thermally-conductive EMI absorber is a dispensable thermally-conductive EMI absorber, a phase change thermal interface material, and/or a pad.

In exemplary embodiments, the thermally-conductive EMI absorber is configured to be multifunctional having a first functionality of EMI mitigation and a second functionality of thermal management, or vice versa.

Also disclosed are exemplary methods comprising mixing at least one filler into a base or matrix material. The at least one filler comprises aluminum powder in a predetermined amount sufficient to increase attenuation such that the base or matrix material including the at least one filler is suitable for use a thermally-conductive EMI absorber.

The at least one filler may further comprises at least one other filler including silicon carbide, zinc oxide, carbonyl iron, cobalt, nickel, carbon, graphite, and/or aluminum oxide. The base or matrix material may comprise a silicone resin and/or wax.

In exemplary embodiments, the at least one filler further comprises aluminum oxide. The base or matrix material comprises wax. The method includes mixing the at least one filler into the base or matrix material such that there is about 7 weight percent to 9 weight percent of the wax base/matrix material, about 4 weight percent to about 6 weight percent of the aluminum oxide, and about 85 weight percent to about 88 weight percent of the aluminum powder. In exemplary embodiment, the method includes mixing the at least one filler into the base or matrix material such that there is about 8 weight percent of the wax base/matrix material, about 5 weight percent of the aluminum oxide, and about 87 weight percent of the aluminum powder. The base or matrix material including the at least one filler has a thermal conductivity of at least about 8.0 Watts per meter per Kelvin, and attenuation greater than 100 dB/cm for frequencies of 18 gigahertz and above. In addition to the wax, the wax base/matrix material may further include one or more additives, such as dispersant, process oil, block copolymer, etc.

In exemplary embodiments, the method includes mixing the at least one filler into the base or matrix material such that the total filler loading in the base or matrix material is at least about 1 percent by weight to about 95 percent by weight including the predetermined amount of the aluminum powder sufficient to increase the thermally-conductive EMI absorber's dielectric constant and attenuation per distance of travel at frequencies above 3 gigahertz.

In exemplary embodiments, the method includes mixing the at least one filler into the base or matrix material such that the base or matrix material including the at least one filler therein has: a thermal conductivity of at least about 3.0 Watts per meter per Kelvin; a permittivity (Dk) of at least 10 at frequencies below about 20 gigahertz; a loss tangent greater than about 0.15 at frequencies above 12 gigahertz; and attenuation above 100 decibels per centimeter at frequencies of 18 gigahertz and above.

In addition to aluminum powder, one or more other fillers may be incorporated into the base or matrix material. The fillers may include functional nanoparticles, electrically-conductive fillers, thermally-conductive fillers, EMI or microwave absorbing fillers, magnetic fillers, coated fillers, combinations thereof, etc. The fillers may be added and mixed into a bulk material including the base or matrix material to thereby provide a mixture of the filler and base or matrix material. Example fillers include carbon black, boron nitride, nickel cobalt, carbonyl iron, iron silicide, iron particles, iron-chrome compounds, silver, an alloy containing 85% iron, 9.5% silicon and 5.5% aluminum, an alloy containing about 20% iron and 80% nickel, ferrites, magnetic alloys, magnetic powders, magnetic flakes, magnetic particles, nickel-based alloys and powders, chrome alloys, oxide, copper, zinc oxide, alumina, graphite, ceramics, silicon carbide, manganese zinc, fiberglass, carbon nanotubes (e.g., single-walled carbon nanotubes, multi-walled carbon nanotubes, and/or carbon nanostructures, etc.), combinations thereof, etc. The fillers may comprise one or more of granules, spheroids, microspheres, ellipsoids, irregular spheroids, strands, flakes, powder, nanotubes, and/or a combination of any or all of these shapes. In addition, exemplary embodiments may also include different grades (e.g., different sizes, different purities, different shapes, etc.) of the same (or different) fillers.

In exemplary embodiments, a thermally-conductive EMI absorber may be used to define or provide part of a thermally-conductive heat path from a heat source to a heat removal/dissipation structure or component. The thermally-conductive EMI absorber may be used, for example, to help conduct thermal energy (e.g., heat, etc.) away from a heat source of an electronic device. The thermally-conductive EMI absorber may be positionable generally between (e.g., directly against in physical contact with, in thermal contact with, etc.) a heat source and a heat removal/dissipation structure or component to establish a thermal joint, interface, pathway, or thermally-conductive heat path along which heat may be transferred (e.g., conducted) from the heat source to the heat removal/dissipation structure or component. During operation, the thermally-conductive EMI absorber may function to allow transfer of heat (e.g., to conduct heat, etc.) from the heat source along the thermally-conductive path to the heat removal/dissipation structure or component. In exemplary embodiments, the thermally-conductive EMI absorber may also be operable for mitigating EMI (e.g., absorbing EMI, etc.) incident upon the thermally-conductive EMI absorber.

Example embodiments disclosed herein may be used with a wide range of heat sources, electronic devices, and/or heat removal/dissipation structures or components (e.g., a heat spreader, a heat sink, a heat pipe, a vapor chamber, a device exterior case or housing, etc.). For example, a heat source may comprise one or more heat generating components or devices (e.g., a CPU, die within underfill, semiconductor device, flip chip device, graphics processing unit (GPU), digital signal processor (DSP), multiprocessor system, integrated circuit (IC), multi-core processor, etc.). Generally, a heat source may comprise any component or device that has a higher temperature than the thermally-conductive EMI absorber or otherwise provides or transfers heat to the thermally-conductive EMI absorber regardless of whether the heat is generated by the heat source or merely transferred through or via the heat source. Accordingly, aspects of the present disclosure should not be limited to use with any single type of heat source, electronic device, heat removal/dissipation structure, etc.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. For example, when permissive phrases, such as "may comprise", "may include", and the like, are used herein, at least one embodiment comprises or includes the feature(s). As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances. Or for example, the term "about" as used herein when modifying a quantity of an ingredient or reactant of the invention or employed refers to variation in the numerical quantity that can happen through typical measuring and handling procedures used, for example, when making concentrates or solutions in the real world through inadvertent error in these procedures; through differences in the manufacture, source, or purity of the ingredients employed to make the compositions or carry out the methods; and the like. The term "about" also encompasses amounts that differ due to different equilibrium conditions for a composition resulting from a particular initial mixture. Whether or not modified by the term "about", equivalents to the quantities are included.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An electromagnetic interference (EMI) absorber comprising a base or matrix material and at least one filler in the base or matrix material, wherein the at least one filler comprises aluminum powder, and wherein the EMI absorber has attenuation greater than 100 decibels per centimeter at frequencies of 18 gigahertz and above.

2. The EMI absorber of claim 1, wherein the EMI absorber further includes at least one other filler in the base or matrix material including one or more of silicon carbide, zinc oxide, carbonyl iron, cobalt, nickel, carbon, graphite, and/or aluminum oxide.

3. An electromagnetic interference (EMI) absorber comprising a base or matrix material and at least one filler in the base or matrix material, wherein the at least one filler comprises aluminum powder to increase the EMI absorber's dielectric constant and attenuation per distance of travel at frequencies above 3 gigahertz relative to the same EMI absorber not containing aluminum powder, and wherein the EMI absorber has attenuation greater than 100 decibels per centimeter at frequencies of 18 gigahertz and above.

4. The EMI absorber of claim 1, wherein the EMI absorber has a thermal conductivity of at least about 3.0 Watts per meter per Kelvin.

5. The EMI absorber of claim 1, wherein the EMI absorber has at least one or more of:
   a permittivity (Dk) of at least 10 at frequencies below about 20 gigahertz;
   a loss tangent greater than about 0.15 at frequencies above 12 gigahertz; and/or
   a loss tangent of about 0.15 or less at a frequency of about 3 gigahertz.

6. The EMI absorber of claim 1, wherein the EMI absorber has:
   attenuation of 140 decibels per centimeter or higher at frequencies of 60 gigahertz and above; and/or
   attenuation of 160 decibels per centimeter or higher at frequencies of 90 gigahertz and above.

7. The EMI absorber of claim 1, wherein the EMI absorber has:
   attenuation greater than 110 decibels per centimeter at frequencies of 60 gigahertz and above; and/or
   attenuation greater than 150 decibels per centimeter at frequencies of 90 gigahertz and above.

8. The EMI absorber of claim 1, wherein:
   the base or matrix material comprises a silicone resin; and
   the at least one filler comprises the aluminum powder blended with at least one other filler including silicon carbide in the silicone resin.

9. The EMI absorber of claim 8, wherein:
   the EMI absorber is a dispensable EMI absorber; and/or
   a ratio of aluminum to silicon carbide in the silicone resin is about 1.1:1; and/or
   a total filler loading of the aluminum powder and the silicon carbide in the silicone resin is at least about 90 percent by weight.

10. The EMI absorber of claim 1, wherein:
    the base or matrix material comprises a silicone resin; and
    the at least one filler comprises the aluminum powder blended with at least one other filler including zinc oxide in the silicone resin; and
    the EMI absorber has:
      a thermal conductivity of at least about 3.0 Watts per meter per Kelvin;
      a permittivity (Dk) of at least 10 at frequencies below about 20 gigahertz;
      a loss tangent greater than about 0.15 at frequencies above 12 gigahertz; and
      attenuation greater than 100 decibels per centimeter at frequencies of 18 gigahertz and above.

11. The EMI absorber of claim 10, wherein the EMI absorber is a phase change thermal interface material.

12. The EMI absorber of claim 1, wherein the EMI absorber is a phase change thermal interface material and/or a pad.

13. The EMI absorber of claim 1, wherein the EMI absorber is a dispensable EMI absorber.

14. The EMI absorber of claim 1, wherein the EMI absorber includes at least about 85 weight percent of the aluminum powder.

15. The EMI absorber of claim 14, wherein the EMI absorber includes about 85 weight percent to about 95 weight percent of the aluminum powder.

16. The EMI absorber of claim 15, wherein the EMI absorber includes about 87 weight percent of the aluminum powder.

17. The EMI absorber of claim 1, wherein the EMI absorber has
   a thermal conductivity of at least about 8.0 Watts per meter per Kelvin.

18. The EMI absorber of claim 15, wherein the EMI absorber includes about 95 weight percent of the aluminum powder.

19. The EMI absorber of claim 1, wherein:
    the EMI absorber includes about 10 weight percent of the aluminum powder; and
    the EMI absorber further includes at least one other filler in the base or matrix material including one or more of silicon carbide, zinc oxide, carbonyl iron, cobalt, nickel, carbon, graphite, and/or aluminum oxide.

20. The EMI absorber of claim 1, wherein the aluminum powder enhances permittivity, loss tangent, and/or attenuation performance of the EMI absorber relative to the same EMI absorber not containing aluminum powder.

21. The EMI absorber of claim 1, wherein the EMI absorber is configured to be multifunctional having a first functionality of EMI mitigation and a second functionality of thermal management, or vice versa.

22. A method comprising mixing at least one filler comprising aluminum powder into a base or matrix material wherein the base or matrix material including the at least one filler has attenuation greater than 100 decibels per centimeter at frequencies of 18 gigahertz and above.

23. The method of claim 22, wherein the method includes mixing at least one other filler into the base or matrix material including one or more of silicon carbide, zinc oxide, carbonyl iron, cobalt, nickel, carbon, graphite, and/or aluminum oxide.

24. The method of claim 22, wherein the method includes mixing the at least one filler into the base or matrix material such that there is at least about 85 weight percent of the aluminum powder.

25. The method of claim 24, wherein the method includes mixing the at least one filler into the base or matrix material such that there is about 85 weight percent to about 95 weight percent of the aluminum powder.

26. The method of claim 22, wherein the method includes increasing dielectric constant of the EMI absorber by using the aluminum powder to thereby provide the EMI absorber with an increased dielectric constant and absorbing property (ies) relative to the same EMI absorber not containing aluminum powder.

27. The method of claim 22, wherein the base or matrix material including the at least one filler has a thermal conductivity of at least about 8.0 Watts per meter per Kelvin.

28. The method of claim 22, wherein the method includes mixing the at least one filler into the base or matrix material such that the total filler loading in the base or matrix material is at least about 1 percent by weight to about 95 percent by weight including the aluminum powder to increase the EMI absorber's dielectric constant and attenuation per distance of travel at frequencies above 3 gigahertz relative to the same EMI absorber not containing aluminum powder.

29. The method of claim 22, wherein the method includes mixing the at least one filler into the base or matrix material such that the base or matrix material including the at least one filler therein has at least one or more of:
    a thermal conductivity of at least about 3.0 Watts per meter per Kelvin;
    a permittivity (Dk) of at least 10 at frequencies below about 20 gigahertz; and/or a loss tangent greater than about 0.15 at frequencies above 12 gigahertz.

\* \* \* \* \*